(12) United States Patent
Dekker et al.

(10) Patent No.: US 6,177,707 B1
(45) Date of Patent: Jan. 23, 2001

(54) SEMICONDUCTOR DEVICE COMPRISING A GLASS SUPPORTING BODY ONTO WHICH A SUBSTRATE WITH SEMICONDUCTOR ELEMENTS AND A METALIZATION IS ATTACHED BY MEANS OF AN ADHESIVE

(75) Inventors: Ronald Dekker; Henricus G. R. Maas; Maria H. W. A. Van Deurzen, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/258,430

(22) Filed: Feb. 26, 1999

(30) Foreign Application Priority Data

Mar. 2, 1998 (EP) .................................................. 98200644

(51) Int. Cl.$^7$ ................................................... H01L 29/10
(52) U.S. Cl. ........................... 257/347; 257/751; 257/752; 257/763; 257/764; 257/765; 257/758; 257/760; 257/348; 257/349; 257/351; 257/353; 257/355
(58) Field of Search .................................... 257/347, 752, 257/751, 763–765, 758–760, 348, 349, 351, 353, 355

(56) References Cited

U.S. PATENT DOCUMENTS 5,646,432  7/1997  Iwaki et al. ............................ 257/347

OTHER PUBLICATIONS

Process for Fabricating Thin Film multilayer Modules Using Photosensitive Epoxy Dielectrics, Tom Swibel, 1997.*

A>400 GHz Transferre–Substrate HTB IC Technology, Pullela et al., 1997.*

MCM–D/L Using Copper/Photosensitive–BCB Multilayer for Upper Microwave Band Systems, Miyagi et alc, 1996.*

* cited by examiner

Primary Examiner—Fetsum Abraham
(74) Attorney, Agent, or Firm—Steven R. Biren

(57) ABSTRACT

A thin film semiconductor device includes a glass supporting body having thereon an insulating substrate which is attached thereto by a layer of adhesive material. On the surface of the substrate facing the supporting body is a layer of semiconductor material which includes therein a semiconductor element, such surface further having thereon a metalization pattern of conductor tracks. An insulating layer is additionally provided between the metalization pattern and the adhesive layer, and has a dielectric constant $\epsilon_r$ below 3 and a thickness in the range of approximately 20 $\mu$m to 60 $\mu$m. By virtue of such additional layer, parasitic capacitances between the metalization pattern and an envelope in which the device is included or a printed circuit board on which the device is mounted are reduced substantially, thereby reducing the power consumption of the device.

4 Claims, 3 Drawing Sheets

SEMICONDUCTOR DEVICE COMPRISING A GLASS SUPPORTING BODY ONTO WHICH A SUBSTRATE WITH SEMICONDUCTOR ELEMENTS AND A METALIZATION IS ATTACHED BY MEANS OF AN ADHESIVE

BACKGROUND OF THE INVENTION

1. Field of the Invention

The invention relates to a semiconductor device comprising a glass supporting body onto which an insulating substrate is attached by means of a layer of an adhesive, said insulating substrate being provided, on its first side facing the supporting body, with a surface on which a semiconductor element is formed in a layer of a semiconductor material and on which a metalization with a pattern of conductor tracks is provided.

The semiconductor element may be a single diode or transistor, but it may alternatively be an integrated circuit comprising a large number of transistors. The metalization may include conductor tracks which interconnect semiconductor elements, but it may alternatively include conductor tracks which are provided with connection electrodes (bonding pads) enabling external contact of the semiconductor device. The metalization may also comprise passive elements, such as capacitors, resistors and coils.

2. Description of the Related Art

The described semiconductor device is particularly suited for processing signals of very high frequencies. If integrated circuits are formed, as customary, on an approximately 500 $\mu$m thick slice of a semiconductor material, only an approximately 1 to 3 $\mu$m thick top layer of this slice is used for forming said integrated circuits. The semiconductor material situated below this thin top layer, i.e. the semiconductor substrate, adversely affects the high-frequency behavior of these circuits, inter alia by the formation of parasitic capacitances between semiconductor elements and this semiconductor substrate. In addition, it is impossible to form high-quality coils on a semiconductor substrate of such thickness, because, during operation, substantial eddy currents are generated in the thick semiconductor substrate situated under the coils. Since, in the semiconductor device mentioned in the opening paragraph, the layer of semiconductor material, having a thickness, for example of 1 to 3 $\mu$m, is very thin, said undesirable influences are substantially counteracted.

In practice, the semiconductor device can be mounted with the glass supporting body in a customary envelope or even on a customary printed circuit board. In an envelope as well as on such a printed circuit board, there is a metalization with conductor tracks for contacting the semiconductor device. The printed circuit board is also provided with a metalization having conductor tracks to connect the semiconductor device to other semiconductor devices and to passive elements, such as resistors and capacitors. The glass supporting body is sandwiched between the metalization of the semiconductor device and said other metalization, so that parasitic capacitances between these metalizations are small.

As indicated hereinabove, the parasitic capacitances in the semiconductor device are very small. As a result, the parasitic currents flowing during processing of high-frequency signals are very small. By virtue thereof, the power consumption of the semiconductor device is small, which is particularly advantageous for application in mobile telephony, where signals with a frequency of approximately 2 GHz must be processed and the power must be supplied by batteries. The power consumption may be a factor of 50 smaller than that of a customary integrated circuit, which is formed on an ordinary, relatively thick slice of semiconductor material.

U.S. Pat. No. 5,646,432 discloses a semiconductor device of the type mentioned in the opening paragraph, in which the semiconductor element and the metalization are covered with an approximately 2 $\mu$m thick passivating layer of silicon nitride, and a less than 2 $\mu$m thick planarizing layer is provided between this passivating layer and the layer of adhesive. The layer of adhesive has a thickness of 10 to 20 $\mu$m.

Although parasitic capacitances, which are formed between the metalization of the semiconductor device and the metalization on a printed circuit board on which the semiconductor device is mounted, are small already, it is desirable to minimize these as much as possible in connection with the power consumption. If the glass supporting body has a dielectric constant $\epsilon_r$ of approximately 6.5 and a thickness of 400 $\mu$m, then the capacitance between a conductor track having a width of 1 $\mu$m and the metalization on the printed circuit board is approximately $26.10^{-18}$ F per $\mu$m of length of the conductor track. This capacitance can be reduced by employing a supporting body having an $\epsilon_r$ which is lower than that of glass. However, this is not a practical solution because such materials, for example quartz, are very expensive. Also the use of a thicker supporting body is impractical because, for example, doubling the thickness to 800 $\mu$m only results in a reduction of said capacitance by approximately 10%. Not only is the increase in thickness of little avail, it also results in a semiconductor device whose thickness is too large and impractical. A practical thickness for the glass supporting body is approximately 400 $\mu$m. In this case, the overall thickness, i.e. including the layer of adhesive and the insulating substrate, is comparable to that of customary semiconductor slices, so that, for example, to envelope the semiconductor device use can be made of equipment which is customarily employed for enveloping semiconductor slices.

SUMMARY OF THE INVENTION

It is an object of the invention to further reduce the power consumption of the above-described device, without the necessity of employing a glass supporting body of impractical thickness or a supporting body of an impractical material. To achieve this, the device mentioned in the opening paragraph is characterized, in accordance with the invention, in that an insulating layer having a dielectric constant $\epsilon_r$ below 3 is provided between the metalization formed on the substrate and the layer of adhesive. The invention is based on the realization that the size of said parasitic capacitances is predominantly determined by the dielectric constant of the dielectric which is closest to the conductors, and that the use of an only relatively thin layer of a material having a relatively low $\epsilon_r$ between the metalization of the semiconductor device and the glass supporting body results in a relatively large reduction of said parasitic capacitances. The measure in accordance with the invention enables the capacitances between the metalization of the semiconductor device and the metalization on a printed circuit board on which the semiconductor device is mounted to be reduced substantially. By using a layer having an $\epsilon_r$ of 2.5 and a thickness of approximately 25 $\mu$m, for example, the capacitance, as in the above-mentioned example, between an 1 $\mu$m wide conductor track and the metalization on the printed circuit board is reduced by 40% when use is made of a 400 $\mu$m thick glass supporting body with an $\epsilon_r$ of 6.5. The power consumption is reduced by practically the same amount.

Preferably, the insulating layer having a dielectric constant $\epsilon_r$ below 3 is also provided between the conductor tracks of the metalization. In the known, described semiconductor device, an approximately 2 μm thick passivating layer of silicon nitride is provided between the metalization and the layer of an adhesive. Such a layer has a relatively large $\epsilon_r$ of approximately 7.5. As a result, the parasitic capacitances between the conductor tracks of the metalization are relatively large. These parasitic capacitances are substantially reduced by also providing the insulating layer between the conductor tracks.

Preferably, the insulating layer is a layer of parylene or benzocyclobutene. Such a dielectric has a dielectric constant $\epsilon_r$ of approximately 2.5. A semiconductor device which can be readily manufactured is characterized in that both the insulating layer having a dielectric constant $\epsilon_r$ below 3 and the layer of an adhesive are layers of benzocyclobutene. Preferably, the layer of parylene or benzocyclobutene is applied in a thickness ranging from 25 to 60 μm. This results in a reduction of the parasitic capacitances between the metalization of the semiconductor device and the metalization on the printed circuit board by more than 40%, while the above-mentioned thickness of 500 μm is not exceeded.

These and other aspects of the invention will be apparent from and elucidated with reference to the embodiments described hereinafter.

DESCRIPTION OF THE PREFERRED EMBODIMENTS

Figure 1:
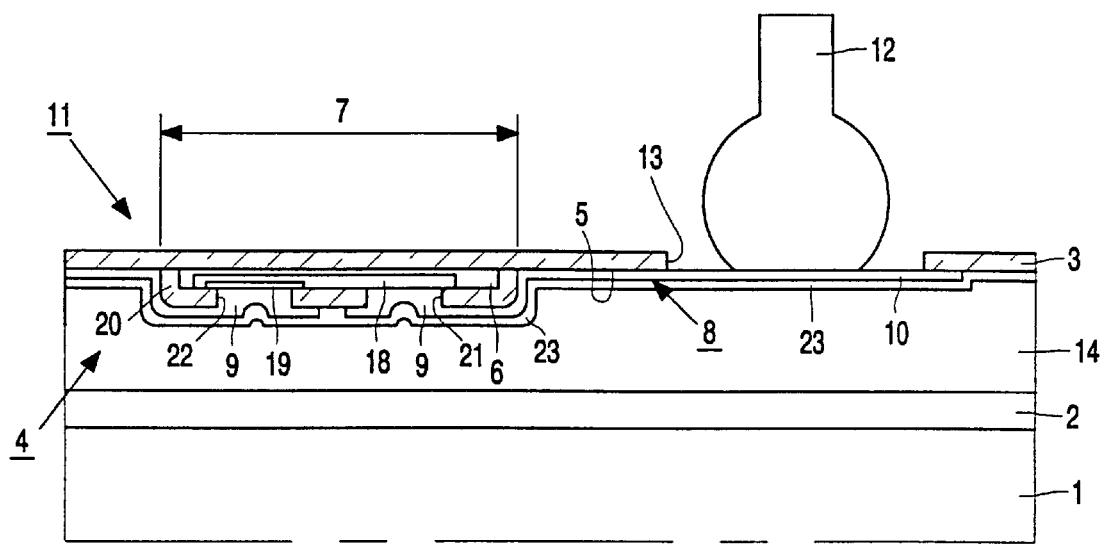
FIG. 1 is a schematic, cross-sectional view of a first embodiment of a semiconductor device in accordance with the invention.

FIG. 1 is a schematic, cross-sectional view of a semiconductor device comprising a glass supporting body 1 onto which an insulating substrate 3 is attached by means of a layer of an adhesive 2, which insulating substrate is provided on its first side 4 facing the supporting body with a surface 5 on which, in a layer of a semiconductor material 6, a semiconductor element 7 is formed, and on which surface a metalization 8 with a pattern of conductors 9 is applied, which is provided with contact electrodes 10 (bonding pads). These contact electrodes serve to make external contact from the second side 11 of the insulating substrate 3 facing away from the supporting body 1, for example by means of a wire 12 which is secured to the electrode 10 by means of a customary bonding technique. The contact electrodes 10 are provided on the first side 4 of the substrate 3, which, at the location of the contact electrodes 10, is provided with windows 13 allowing contact to be made from the second side 11.

In this example, a single semiconductor element 7, in this case a bipolar transistor, is shown. In practice, however, such a semiconductor device may also comprise a large number of such elements. In the first case, the semiconductor device is referred to as a discrete semiconductor device, and in the second case it is referred to as an integrated semiconductor device. Instead of the bipolar transistor 5 shown, the semiconductor element used may be, for example, a field-effect transistor. In addition to these active elements, the semiconductor device may comprise passive elements, such as coils, capacitors and light guides.

An insulating layer 14 having a dielectric constant $\epsilon_r$ below 3 is provided between the metalization 8 formed on the insulating substrate 3 and the layer of an adhesive 2. By virtue of this measure, parasitic capacitances between the metalization of the semiconductor device and the metalization in an envelope in which the semiconductor device is accommodated, or the metalization on a printed circuit board on which the semiconductor device is mounted, can be reduced substantially. The use of a layer having an $\epsilon_r$ of 2.5 and a thickness of approximately 25 μm enables, for example, this capacitance between an 1 μm wide conductor track and the metalization on the printed circuit board to be reduced by 40% when use is made of a 400 μm thick glass supporting body. Without the insulating layer 14, the size of this capacitance is $26 \cdot 10^{-18}$ F per μm of length of the conductor track; when a 20 μm thick insulating layer is used, the capacitance is $16.2 \cdot 10^{-18}$ F per μm of length, and a 50 μm thick insulating layer results in a capacitance of $14.4 \cdot 10^{-18}$ F per μm of length, which means a reduction by, respectively, 38% and 45%. The use of the layer with the low $\gamma_r$ causes the power consumption of the semiconductor device to be reduced by practically the same amounts.

FIGS. 2 through 5 are schematic, cross-sectional views of a few stages in the manufacture of the semiconductor device shown in FIG. 1.

Figure 2:
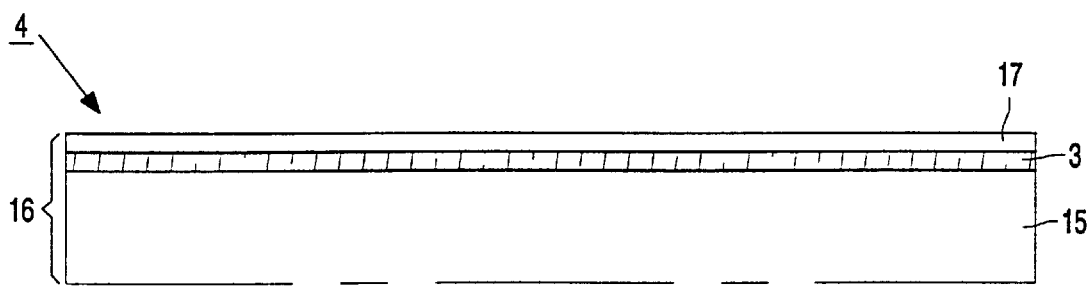
FIGS. 2 through 5 are schematic, cross-sectional views of a few stages in the manufacture of the semiconductor device shown in FIG. 1.

For the starting material use is made of a slice of silicon 16 shown in FIG. 2. This slice of silicon is provided, on the first side 4, with an insulating layer 3 of silicon oxide having a thickness of approximately 0.4 μm, and with an approximately 1 μm thick layer of silicon 17 which is relatively lightly doped with approximately $10^{16}$ phosphor atoms per cc. Such a slice can be made, for example, by means of customary slice-interconnection techniques. In such techniques, a first slice of silicon, which is provided with a top layer of silicon oxide, is connected with this top layer to a second slice of silicon, whereafter silicon is removed from the first slice until only said thin layer of silicon remains on the oxide layer. The slice 16 can also be obtained by forming the silicon oxide layer 3 at a depth of approximately 0.3 μm by means of implantation of oxygen ions and epitaxially growing the silicon layer situated above the silicon oxide layer 3 until the approximately 1 μm thick layer 17 is obtained, which layer is finally provided with said doping by ion implantation.

Figure 3:
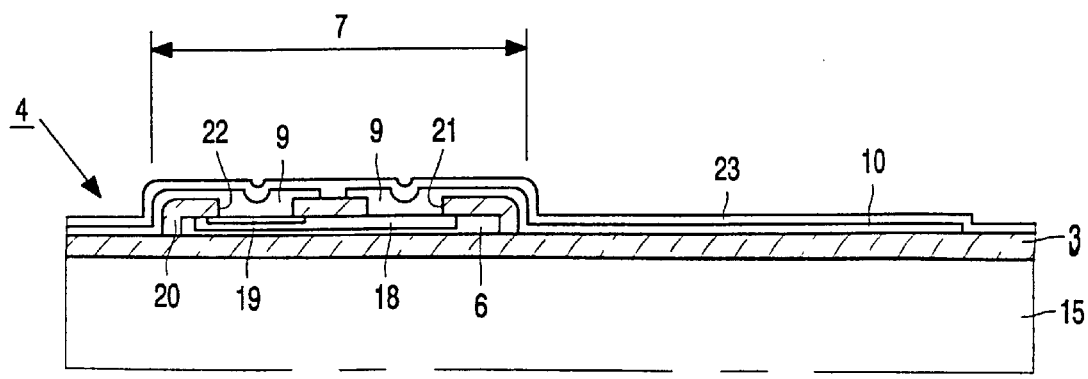
Figure 4:
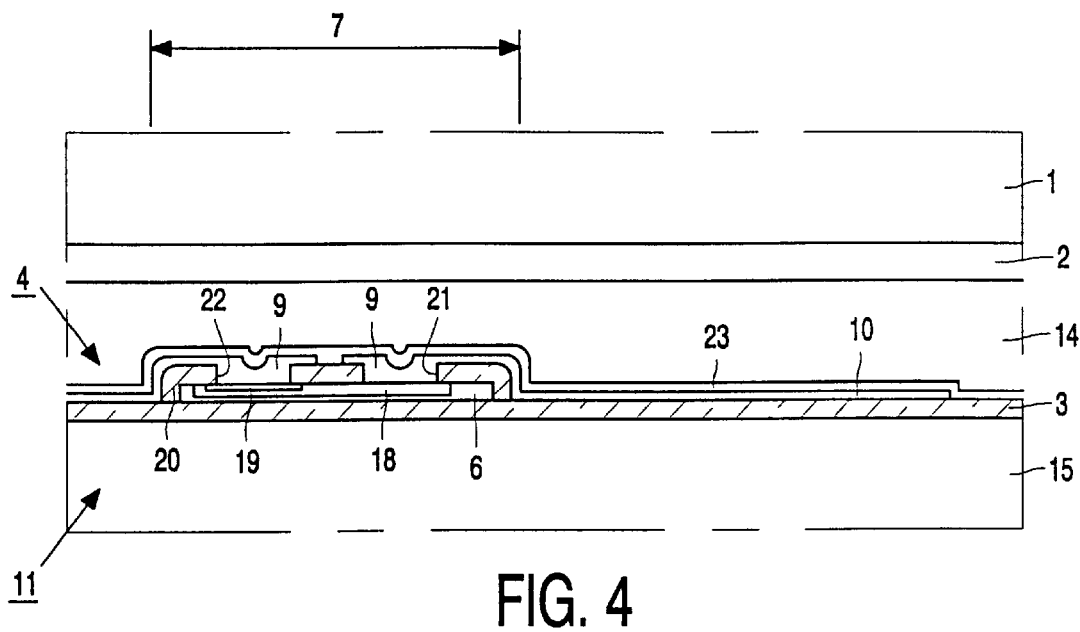
Figure 5:
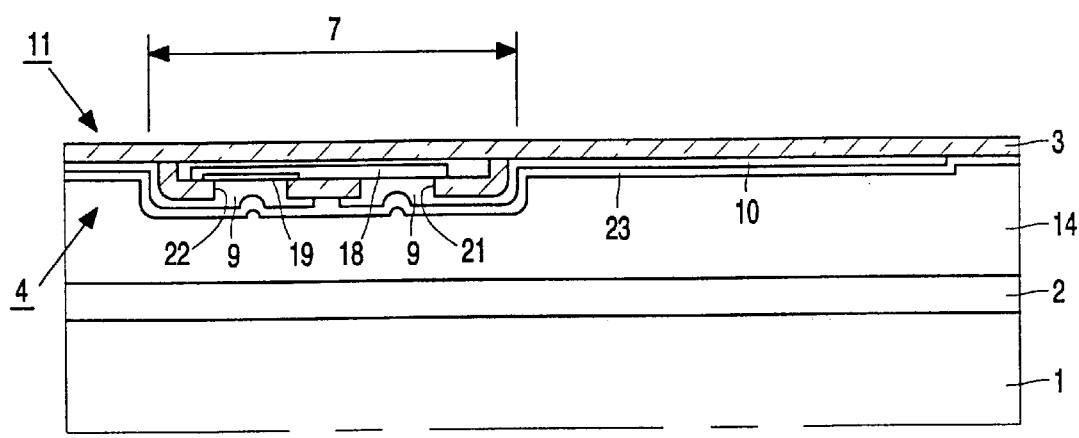

As shown in FIG. 3, an insulated island 6 is formed in the silicon layer. In this example, this is achieved by removing a part of the layer 17 from the insulating layer 3. In the silicon island 6, there is subsequently formed, in a customary manner, the bipolar transistor 7 having a base region 18 with a doping of approximately $5 \cdot 10^{17}$ boron atoms and an emitter region 19 with a doping of approximately $10^{20}$ arsenic atoms. Subsequently, the silicon island 6 is provided with a layer of silicon oxide 20 in which windows 21 and 22 are formed for contacting, respectively, the base region 18 and the emitter region 19.

After the formation of the transistor 7, the metalization 8 with a pattern of conductor tracks 9 and contact electrodes 10 is formed in a layer of aluminium deposited on the substrate 3. For clarity, the semiconductor device is not drawn to scale in the Figures; in practice, for example, the conductor tracks 9 have a width of approximately 1 μm, and the contact electrodes have a length and a width of approximately 100 μm.

Subsequently, the assembly is covered with an approximately 2 μm thick passivating layer of silicon nitride 23 and with an approximately 25 μm thick insulating layer 14 having a dielectric constant $\epsilon_r$ below 3. Next, the assembly is attached with the first side 4 to the glass supporting body 1 by means of the approximately 15 μm thick layer of adhesive 2. Said adhesive is, for example, an epoxy or acrylate adhesive. Subsequently, the slice of silicon 16 is removed down to the insulating layer 3. To this end, the second side 11 of the slice 16 is subjected to a chemico-mechanical polishing treatment, which is continued until the distance to the insulating layer 3 is only a few tens of μm, whereafter the layer 3 is exposed in an etch bath of KOH. This etching treatment stops automatically when the insulating layer 3 of silicon oxide has been reached.

Finally, the windows 13 having a length and a width of approximately 90 μm are provided in the substrate 3 in a customary manner using a contact mask and a HF-containing etch bath. From the second side 11, finally, the contact wires 12 can be provided.

In this example, the contact wires are formed by a customary wire-bonding technique. They may alternatively be formed from electrochemically grown metal parts (bumps).

Figure 6:
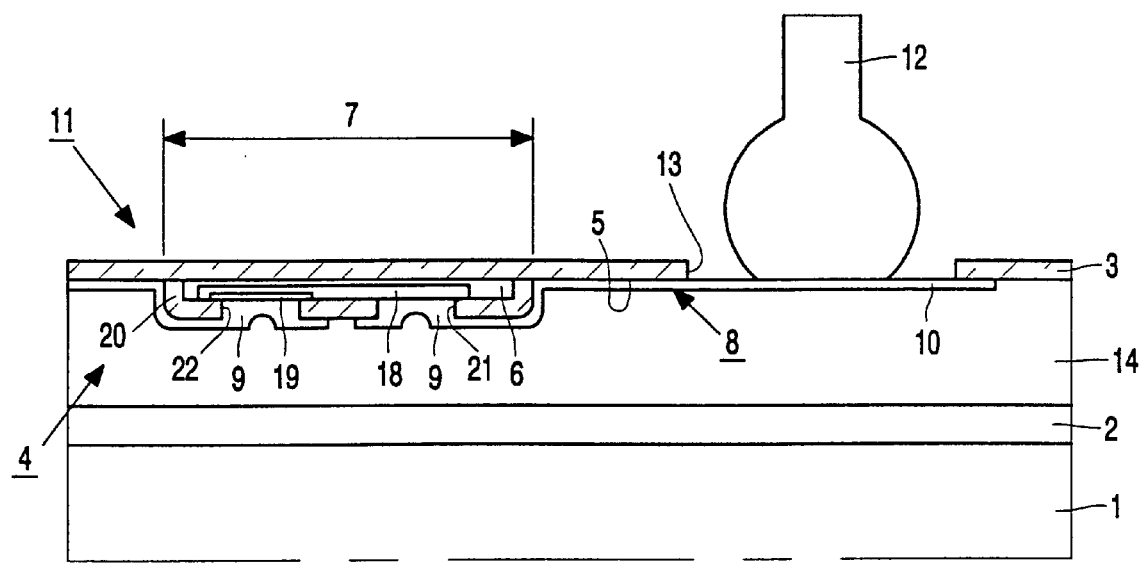
FIG. 6 is a schematic, cross-sectional view of a second embodiment of a semiconductor device in accordance with the invention.

FIG. 6 is a schematic, cross-sectional view of a second embodiment of the semiconductor device in accordance with the invention, in which corresponding parts are denoted by the same reference numerals as in the example associated with FIG. 1. In this example, the insulating layer 14 having a dielectric constant $\epsilon_r$ below 3 is also provided between the conductor tracks 9 of the metalization 8. The passivating layer 23 shown in FIG. 1 is omitted. In the semiconductor device shown in FIG. 1, an approximately 2 μm thick passivating layer 23 of silicon nitride is provided between the metalization and the layer of adhesive. Such a layer has a relatively large $\epsilon_r$ of approximately 7.5. As a result, the parasitic capacitances between the conductor tracks of the metalization are relatively large. By providing the insulating layer also between the conductor tracks, it is achieved that also these parasitic capacitances are substantially reduced.

Preferably, the insulating layer is a layer of parylene or benzocyclobutene. Such a dielectric has a dielectric constant $\epsilon_r$ of approximately 2.5 . The insulating layer 14 of parylene or benzocyclobutene is provided in a thickness ranging from 25 to 60 μm. As a result, the size of the parasitic capacitances between the metalization of the semiconductor device and the metalization on the printed circuit board is reduced by more than 40%, while the above-mentioned thickness of 500 μm is not exceeded.

Figure 7:
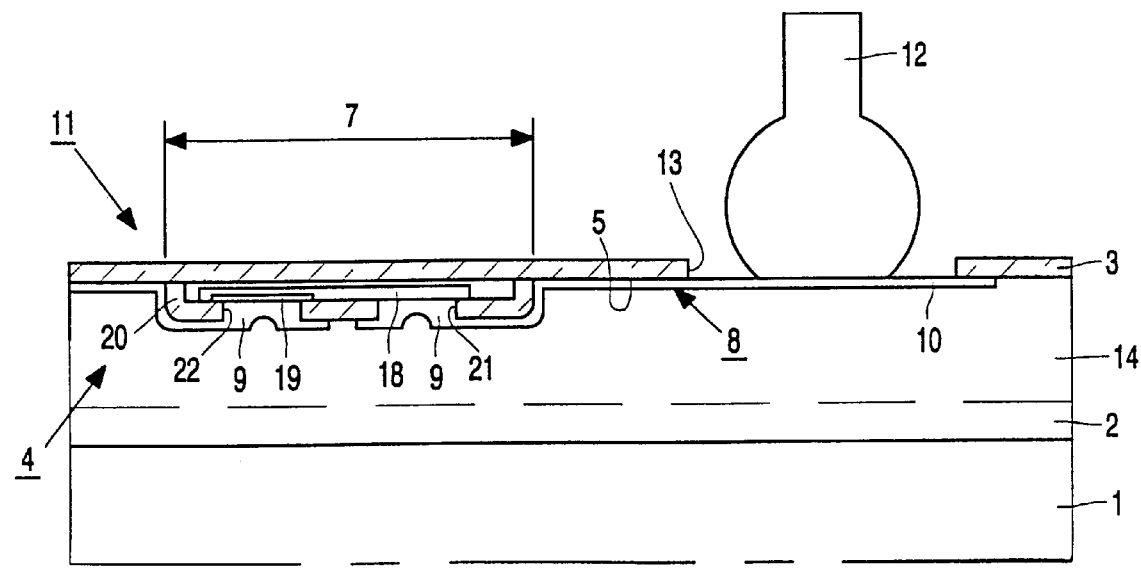
FIG. 7 is a schematic, cross-sectional view of a third embodiment of a semiconductor device in accordance with the invention.

A semiconductor device which can be readily manufactured is characterized in that both the insulating layer 14 having a dielectric constant $\epsilon_r$ below 3 and the layer of an adhesive 24 are benzocyclobutene layers. This embodiment is shown in FIG. 7. Also in this case, corresponding parts are denoted by the same reference numerals as used in the embodiment associated with FIG. 1. This embodiment can be readily produced by providing the slice 15 with the insulating layer 14 and the supporting body with the adhesive layer 22, and, subsequently, pressing both slices together.

What is claimed is:

1. A thin film semiconductor device comprising:
    a glass supporting body having thereon an insulating substrate which is attached thereto by a layer of adhesive material;
    said substrate having, on a surface thereof facing the glass supporting body, a layer of semiconductor material which includes a semiconductor element, said substrate surface further having thereon a metalization pattern of conductor tracks; and
    an insulating layer provided between said metalization pattern and said layer of adhesive material, said insulating layer having a dielectric constant $\gamma_r$ below 3 and a thickness in the range of approximately 20 μm to 60 μm.

2. A semiconductor device as claimed in claim 1, characterized in that the insulating layer having a dielectric constant $\epsilon_r$ below 3 is also provided between the conductor tracks of the metalization.

3. A semiconductor device as claimed in claim 1, characterized in that the insulating layer having a dielectric constant $\epsilon_r$ below 3 is a layer of parylene or benzocyclobutene.

4. A semiconductor device as claimed in claim 3, characterized in that both the insulating layer having a dielectric constant $\epsilon_r$ below 3 and the layer of an adhesive are layers of benzocyclobutene.

* * * * *